US011139259B1

(12) United States Patent
Wu et al.

(10) Patent No.: US 11,139,259 B1
(45) Date of Patent: Oct. 5, 2021

(54) DISPLAY DRIVING SYSTEM, DISPLAY PANEL AND ELECTRONIC DEVICE

(71) Applicant: BEIJING XIAOMI MOBILE SOFTWARE CO., LTD., Beijing (CN)

(72) Inventors: Tsang-chih Wu, Beijing (CN); Yung Chi Wen, Beijing (CN)

(73) Assignee: BEIJING XIAOMI MOBILE SOFTWARE CO., LTD., Beijing (CN)

( * ) Notice: Subject to any disclaimer, the term of this patent is extended or adjusted under 35 U.S.C. 154(b) by 0 days.

(21) Appl. No.: 17/016,516

(22) Filed: Sep. 10, 2020

(30) Foreign Application Priority Data

Mar. 31, 2020 (CN) .......................... 202010243075.8

(51) Int. Cl.
*H01L 23/00* (2006.01)
*G09G 3/3266* (2016.01)
*G09G 3/3225* (2016.01)
*G09G 3/3275* (2016.01)

(52) U.S. Cl.
CPC ........... *H01L 24/08* (2013.01); *G09G 3/3225* (2013.01); *G09G 3/3266* (2013.01); *G09G 3/3275* (2013.01); *G09G 2330/00* (2013.01); *H01L 2224/08145* (2013.01)

(58) Field of Classification Search
None
See application file for complete search history.

(56) References Cited

U.S. PATENT DOCUMENTS

| | | |
|---|---|---|
| 2007/0028012 A1 | 2/2007 | Nonoyama et al. |
| 2012/0038621 A1* | 2/2012 | Nose ..................... G09G 3/3677 345/213 |
| 2013/0155036 A1 | 6/2013 | Kim et al. |
| 2014/0151882 A1* | 6/2014 | Morimoto ........... H01L 27/0688 257/739 |
| 2015/0103104 A1 | 4/2015 | Lee et al. |
| 2017/0011683 A1 | 1/2017 | Bae et al. |
| 2017/0109511 A1* | 4/2017 | Dass .................. G06K 9/00604 |
| 2017/0154873 A1* | 6/2017 | Kim ........................ H01L 24/17 |
| 2018/0082989 A1 | 3/2018 | Fong et al. |

FOREIGN PATENT DOCUMENTS

EP 2779332 A1 9/2014

OTHER PUBLICATIONS

Extended European Search Report (EESR) in Application No. 20197521.6 dated Jul. 7, 2021.

* cited by examiner

*Primary Examiner* — Christopher J Kohlman
(74) *Attorney, Agent, or Firm* — Syncoda LLC; Feng Ma

(57) ABSTRACT

A display driving system includes a first chip and a second chip that are vertically docked; the first chip includes a first substrate and a first silicon wafer provided on a side of the first chip away from the first substrate; the second chip includes a second substrate and a second silicon wafer provided on a side of the second chip away from the second substrate; the first chip is docked with the second chip through docking of the first silicon wafer and the second silicon wafer; wherein, the first chip is configured to provide driving data, and the second chip is configured to process image data.

18 Claims, 3 Drawing Sheets

DISPLAY DRIVING SYSTEM, DISPLAY PANEL AND ELECTRONIC DEVICE

CROSS-REFERENCE TO RELATED APPLICATION

This application claims priority to Chinese Patent Application No. 202010243075.8 filed on Mar. 31, 2020, the disclosure of which is hereby incorporated by reference in its entirety.

BACKGROUND

An Active Matrix Organic Light-Emitting Diode (AMOLED) display driver chip usually includes the following circuits: (1) circuits for image signal processing, such as a pixel statistics and correction logic, a pixel color processing logic, a grayscale mapping circuit, an image RAM, a De-mura cache, etc.; (2) digital circuits related to control of signal time sequence, such as a latch circuit, a shift register circuit, a T-CON circuit, an instruction control unit, a crystal oscillator circuit, etc.; (3) signal receiving circuits for receiving data from a host side, such as an input I/F, a Display Serial Interface (DSI) physical layer and other modulation circuits; 4) a power supply control circuit and power devices therein for providing internal operating power; 5) an Electro-Static Discharge (ESD) circuit for circuit protection, a PCD circuit related to physical conditions of the display screen, etc.; 6) a Gate on Array (GOA) control circuit, a source driving circuit, a digital-to-analog conversion circuit, a Gamma circuit, a MUX circuit and so on which are used to drive pixels on a display screen and GOA circuits, etc.

SUMMARY

The present disclosure generally relates to the field of display technologies, and more specifically to a display driving system, a display panel, and an electronic device.

According to a first aspect of embodiments of the present disclosure, there is provided a display driving system including a first chip and a second chip that are vertically docked; the first chip includes a first substrate and a first silicon wafer provided on a side away from the first substrate; the second chip includes a second substrate and a second silicon wafer provided on a side away from the second substrate; the first chip is docked with the second chip through the first silicon wafer and the second silicon wafer; wherein, the first chip is configured to provide driving data, and the second chip is configured to process image data.

In some embodiments, the first chip includes a plurality of connection pins for connecting an external array substrate; the plurality of connection pins are provided on a side of the first substrate away from the first silicon wafer, and are connected to circuits in the first chip through vias on the first substrate.

In some embodiments, contact portions of the first silicon wafer and the second silicon wafer are planarized through a polishing process.

In some embodiments, the first chip includes at least one of a source driving circuit, a gate driving circuit, a Gamma circuit, a power supply control circuit including power devices, a digital-to-analog conversion circuit, and a Gamma circuit.

In some embodiments, a size of a transistor in the first chip is larger than the size of the transistor in the second chip.

In some embodiments, the second chip includes at least one of a grayscale mapping circuit, a T-CON circuit, a crystal oscillator circuit, an instruction control unit, a DSI physical layer, an image cache module, a pixel enhancement module, a pixel color processing logic module, a sub-pixel rendering logic module, a pixel statistics and correction logic module, a shift register circuit, a latch circuit and a De-mura cache.

In some embodiments, an area of the first chip is larger than the area of the second chip.

In some embodiments, an area of the first chip is equal to the area of the second chip; the second chip includes a first area and a second area, wherein a circuit for processing image data is provided in the first area, an amplified logic circuit is provided in the second area.

According to a second aspect of the embodiments of the present disclosure, there is provided a display panel including an array substrate and the display driving system according to any one of the first aspect; a plurality of connecting pins of the first chip in the display driving system are connected to connection terminals on the array substrate, and are configured to provide driving data and processed image data to the array substrate.

According to a third aspect of the embodiments of the present disclosure, there is provided an electronic device including:

the display panel according to the second aspect;
a processor; and
memory for storing a computer program executable by the processor,
the processor is configured to execute the computer program in the memory to provide display on the display panel.

It should be understood that the above general description and the following detailed description are only exemplary and explanatory, and do not limit the present disclosure.

BRIEF DESCRIPTION OF THE DRAWINGS

The drawings herein are incorporated in and constitute a part of this disclosure, illustrate embodiments consistent with the present disclosure, and together with the description serve to explain principles of various embodiments the present disclosure.

DETAILED DESCRIPTION

Exemplary embodiments will be described in detail here, examples of which are illustrated in the accompanying drawings. When the following description refers to the accompanying drawings, the same numerals in different drawings represent the same or similar elements unless otherwise indicated. The implementations described in the following exemplary embodiments do not represent all implementations consistent with the present disclosure.

Rather, they are merely examples of devices consistent with some aspects of the disclosure as detailed in the appended claims.

Figure 1:
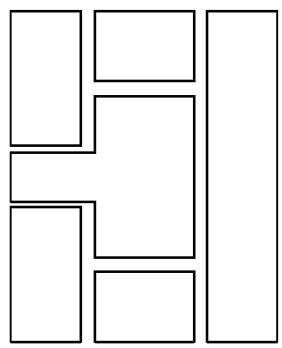
FIG. 1 is a high-level schematic diagram of a circuit layout of a display driving chip in some embodiments.

The circuits in the display driver chip can be integrated into the display driver chip through a process of the same generation, and a layout of the circuits is shown in FIG. 1. However, such integration method will cause that the image information processing circuits cannot occupy a sufficient area, which is not conducive to improving a computing capability of the image information processing circuits. At the same time, the power supply control circuit, the power devices, the ESD circuit, the source drive circuit, the digital-to-analog conversion circuit, the GOA control circuit and so on must maintain an almost constant area, and as the size in the process decreases or the number of pixel rows/columns to be driven increases, these circuits that require a constant area will greatly increase the cost of the display driver chip.

In this case, all the circuits are integrated on a substrate to form the AMOLED display driver chip, the circuits of different functions have different design requirements for the chip, for example, the power supply control circuit, the power devices, the ESD circuit, the source driving circuit, the analog-to-digital conversion circuit, the GOA control circuit and so on must maintain an almost constant area, and the image information processing circuits need to occupy a sufficient area, which is not conducive to reducing the size of the driving chip.

The inventors of the present disclosure have recognized that in the process of preparing the display driving module, the size of the transistors in the circuits for providing the driving data is large, which can provide large driving circuits and/or large driving currents, and the size of the transistors in circuits for processing image data is small, so that they can perform calculation at a faster switching frequency.

Based on the above analysis, various embodiments of the present disclosure provide a display driving module. According to the functions of the circuits, the circuits related to providing driving data are arranged on a first chip, and the circuits related to processing image data are arranged on a second chip; the first chip and the second chip are vertically docked to form the display driving module.

In this way, the transistors in the circuits on the first chip can be manufactured in the same process, and the transistors in the circuits on the second chip can be manufactured in the same process, which can not only reduce the manufacturing difficulty, but also ensure the driving capability of the first chip and the computing capability of the second chip. Moreover, since the circuits in the display driving module are respectively arranged in two chips, the area of the stacked first and second chips will be much smaller than the area of the one chip on which all the circuits are integrated. In other words, when the area of each of the first chip and the second chip is the same as the area of the display drive module in the related art, more circuits can be provided thereon, which facilitates reducing the cost of the display driving module.

Figure 2:
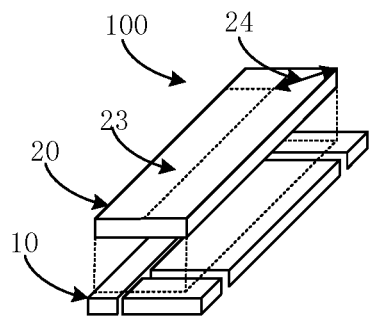
FIG. 2 is a schematic structural diagram of a display driving module according to some embodiments.
Figure 3:
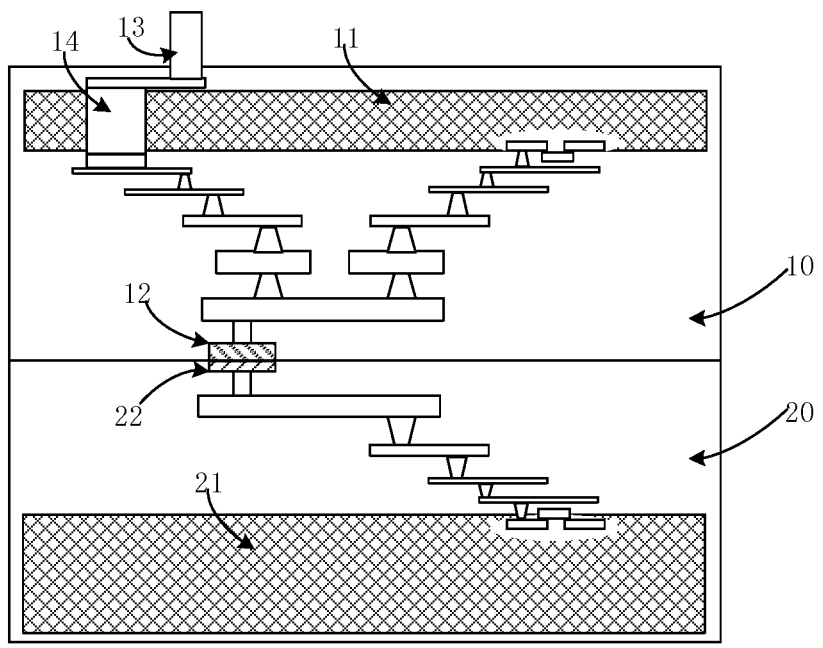
FIG. 3 is a schematic cross-sectional view of a display driving module according to some embodiments.

FIG. 2 is a schematic structural diagram of a display driving module according to some embodiments, and FIG. 3 is a schematic cross-sectional diagram of a display driving module according to some embodiments. Referring to FIGS. 2 and 3, a display driving module 100 includes a first chip 10 and a second chip 20 that are vertically docked. The first chip 10 includes a first substrate 11 and a first silicon wafer 12 provided on a side away from the first substrate 11. The second chip 20 includes a second substrate 21 and a second silicon wafer 22 provided on a side away from the second substrate 21. The first chip 10 is docked with the second silicon wafer 22 of the second chip 20 through the first silicon wafer 12. The first chip 10 is configured to provide driving data, and the second chip 20 is configured to process image data.

Taking the preparation of the first chip 10 as an example, the circuits of the first chip 10 can be made by using a patterning process in the related art, and in the preparation process, corresponding routing can be formed in and between various layers such as a gate layer, a gate protection layer, a source-drain layer, a planarization layers, etc. A metal layer is then formed above the routing so that the routing can be connected to the metal layer. After that, an insulation layer or a planarization layer is formed on the top of the first chip 10. Finally, a polishing process is used to planarize the top of the first chip 10 to obtain a first silicon wafer. It can be understood that due to the polishing process, the metal at a specified position on the metal layer can be exposed from the first silicon wafer, that is, a metal connection point 12 is formed.

Figure 4:
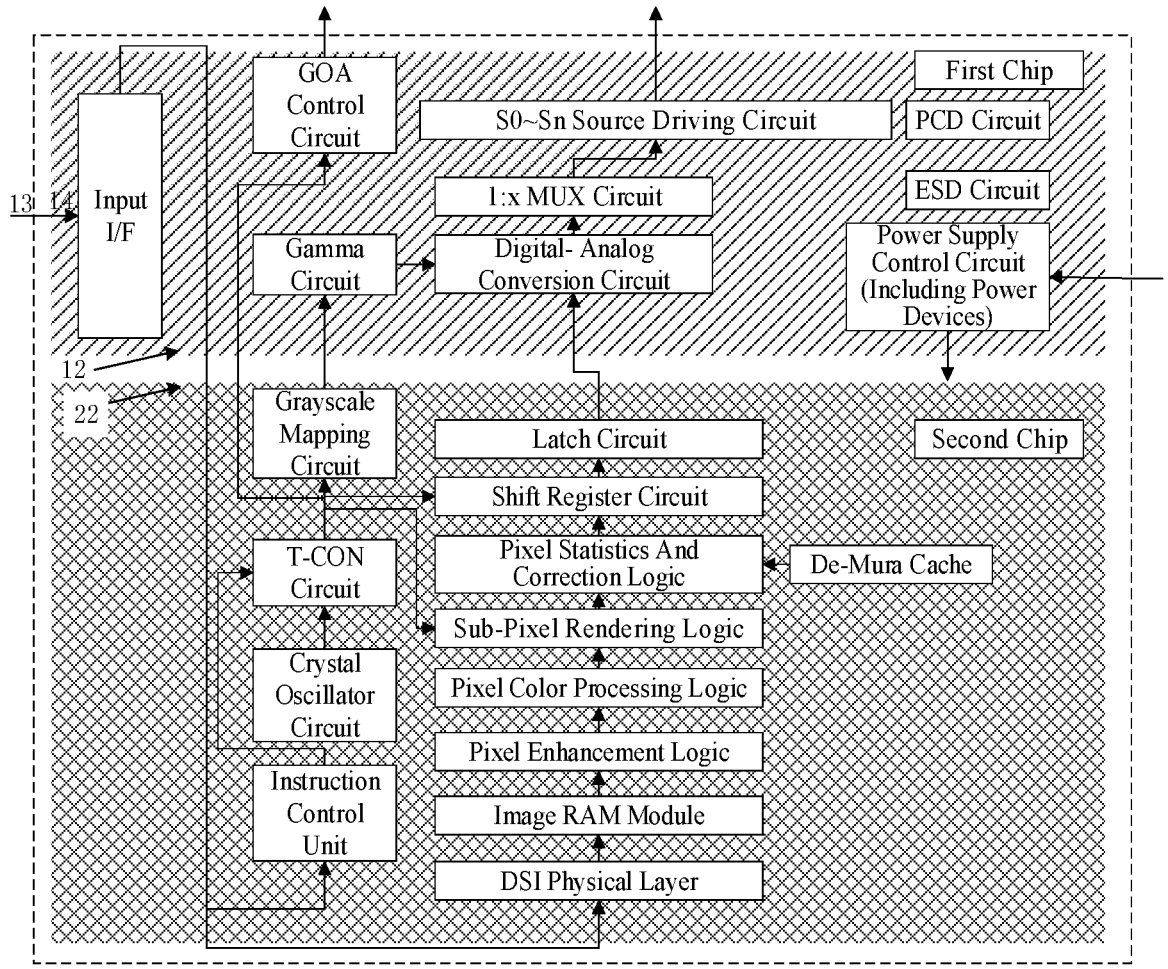
FIG. 4 is a functional block diagram of a display driving module according to some embodiments.

In an example, referring to FIG. 4, the first chip 10 can include at least one of the following circuits: a source driving circuit, a gate driving circuit, a Gamma circuit, a power supply control circuit including power devices, a digital-to-analog conversion circuit, and a Gamma circuit. It should be noted that the first chip 10 is configured to provide the driving data, and thus at least one of the circuits in the first chip 10 is provided with respect to the driving data. In actual applications, in consideration of the circuit layout, the manufacturing process and other factors, the first chip 10 can also include several other circuits, and the corresponding solutions fall within the protection scope of the present disclosure.

Taking the preparation of the second chip 20 as an example, the circuits of the second chip 20 can be made by using the patterning process in the related art, and in the preparation process, corresponding routing can be formed in and between various layers such as a gate layer, a gate protection layer, a source-drain layer, a planarization layers, etc. A metal layer is then formed above the routing so that the routing can be connected to the metal layer. After that, an insulation layer or a planarization layer is formed on the top of the second chip 20. Finally, a polishing process is used to planarize the top of the second chip 20 to obtain a second silicon wafer. It can be understood that due to the polishing process, the metal at a specified position on the metal layer can be exposed from the second silicon wafer, that is, a metal connection point 22 is formed.

In an example, referring to FIG. 4, the second chip 20 can include at least one of the following circuits: a grayscale mapping circuit, a T-CON circuit, a crystal oscillator circuit, an instruction control unit, a DSI physical layer, an image RAM module, and a pixel enhancement module, a pixel color processing logic module, a sub-pixel rendering logic module, a pixel statistics and correction logic module, a shift register circuit, a latch circuit and a De-mura cache. It should be noted that the second chip 20 is used to process the image data, and thus the circuits in the second chip 20 are also provided with respect to processing of the image data. In actual applications, in consideration of the circuit layout, the manufacturing process and other factors, the second chip 20 can also include several other circuits, and the corresponding solutions fall within the protection scope of the present disclosure.

It can be understood that the configurations of the first chip 10 and the second chip 20 are marked in different background formats in FIG. 4.

In this embodiment, in consideration of the functions of the first chip 10 and the second chip 20, the size of the transistors in the first chip 10 will be larger than the size of the transistors in the second chip 20. That is, the transistors of large size are used in the first chip 20 to provide large driving circuits and/or large driving currents so as to provide the driving data, and the transistors of small size are used in the second chip 20 to perform calculation at a faster switching frequency so as to ensure the computing capability.

In this embodiment, with reference to FIG. 2, the area of the display driving module formed by stacking the first chip 10 and the second chip 20 is much smaller than the area of the one integrated chip, that is, the area of the module shown in FIG. 2 is much smaller than the area of the chip shown in FIG. 1. In other words, when the area of each of the first chip 10 and the second chip 20 is the same as the area of the display driving chip in the related art, more circuits can be provided in the first chip 10 and the second chip 20 respectively. For example, since the sizes of the transistors in the first chip 10 and the second chip 20 are different, the area of the first chip 10 will be larger than the area of the second chip 20, and the circuits for processing the image data are provided in a first area 23 of the second chip 20 in FIG. 2. When amplification is required in the design process, a second region 24 (corresponding to a portion of the first chip 10 that is larger than the second chip 20) can be provided with amplified logic circuits, and since only the circuits in the second chip 20 need to be properly adjusted and there is sufficient area, the design difficulty can be reduced, and it facilitates reducing the cost of the display driving module. In practical applications, the second region 24 can also be provided with part of the driving module, so that the areas of the first chip 10 and the second chip 20 are kept the same or similar.

After the first chip 10 and the second chip 20 are made, the first chip 10 can be docked with the second silicon wafer of the second chip 20 through the first silicon wafer, that is, the two chips (10, 20) are docked back-to-back. After the docking, the metal connection point 12 on the first silicon wafer can be in contact with the metal connection point 22 on the second silicon wafer, so that the first chip 10 and the second chip 20 are electrically connected, and the display driving module can be obtained. In this display driving module, the first chip 10 can provide the driving data such as gate drive signals, pixel data, etc., and the second chip 20 can process the image data, such as image gray-scale mapping, pixel enhancement, pixel color processing, sub-pixel rendering, pixel correction, etc., to achieve the expected driving effect.

Considering that the display driving module needs to be connected with an external array substrate, continuing to refer to FIG. 3, in this embodiment, the first chip 10 further includes a plurality of connection pins 13, and the plurality of connection pins 13 are connected with the circuits in the first chip 10 through vias 14. In this way, the display driving module can obtain the image data through the plurality of connection pins 13 and transmit them to the second chip 20 for processing. After being processed by the second chip 20, the image data can be transmitted to the first chip 10. The driving data and the processed image data can be provided to the external array substrate by the first chip 10 through the plurality of connection pins 13 to ensure the normal operation of the array substrate.

Referring to FIGS. 3 and 4, in an example where the input I/F module outputs data to the instruction control unit, an input terminal of the input I/F module is connected to the connection pins 13 via the vias 14, so that external data can be transmitted to the input I/F module through the connection pins 13. After the received data are processed by the input I/F module, the processed data can be transmitted to the instruction control unit through the contact of the metal connection point 12 and the metal connection point 22. Of course, as shown in FIG. 4, when the data transmission is performed by the gray-scale mapping circuit, the Gamma circuit, the latch circuit and the digital-to-analog conversion circuit, the data transmission between the first chip and the second chip can also be realized through the metal connection point 12 and the metal connection point 22.

As such, in the embodiments of the present disclosure, the first display driving module is formed by the first chip and the second chip that are vertically docked, where the first chip is docked with the second chip through the first silicon wafer and the second silicon wafer; the first chip is configured to provide driving data, and the second chip is configured to process image data. In this way, by stacking the first chip and the second chip in the embodiments, the area of the display driving module can be reduced, and sufficient areas occupied by the circuits in the first chip and the second chip can be ensured, which facilitates improving the driving capability of the circuits in the first chip and the computing capability of the circuits in the second chip.

Various embodiments of the present disclosure also provide a display panel including an array substrate and the display driving module in the embodiments shown in FIGS. 2 to 4; a plurality of connection pins of the first chip in the display driving module are connected to connection terminals on the array substrate and are used for providing driving data and processed image data to the array substrate.

It can be understood that since the area of the display driving module is reduced, it facilitates reducing the area of the display panel, thereby reducing the cost for producing the display panel.

Figure 5:
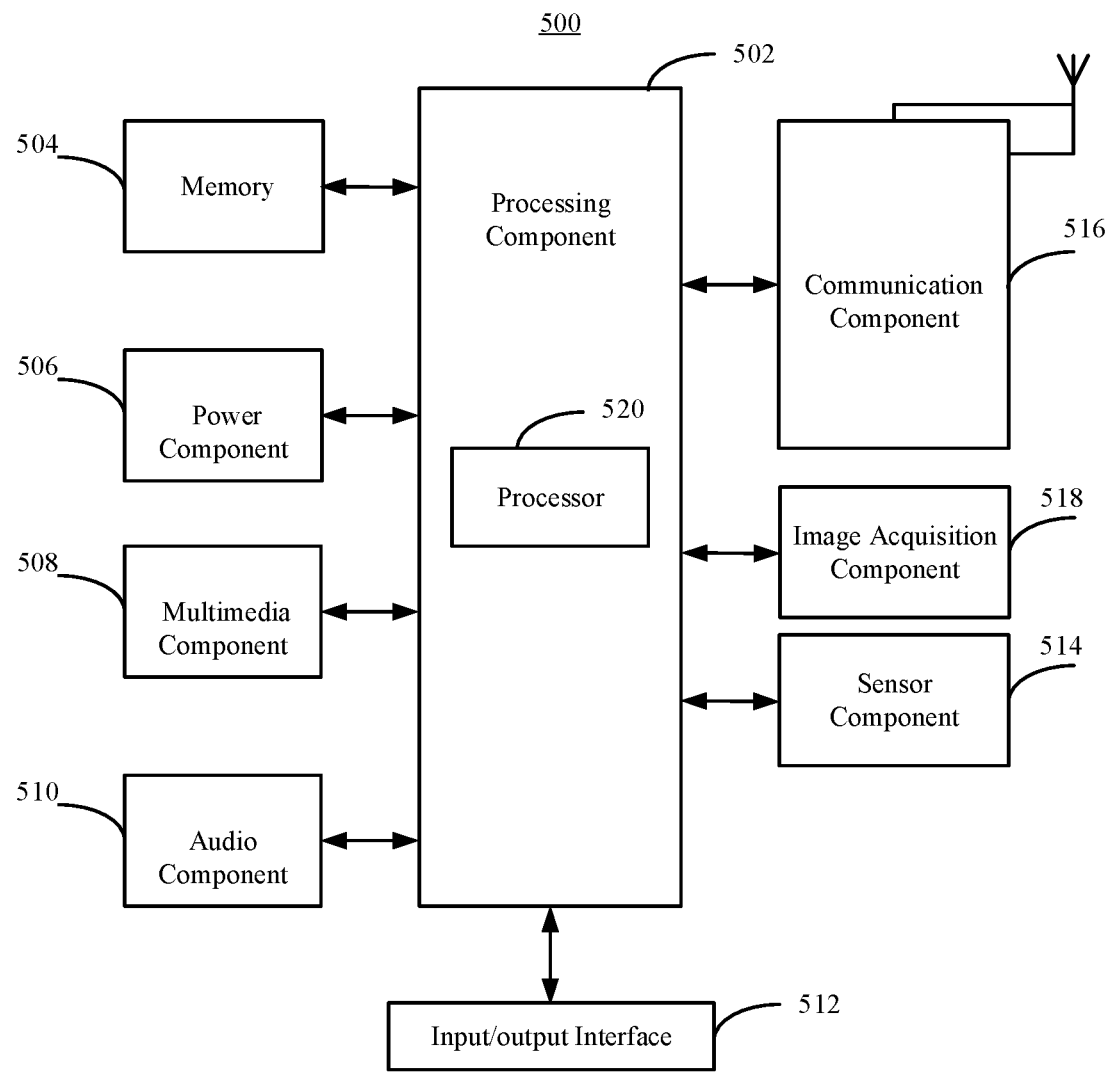
FIG. 5 is a block diagram of an electronic device according to some embodiments.

FIG. 5 is a block diagram of an electronic device according to some embodiments. For example, the electronic device 500 may be a mobile phone, a computer, a digital broadcast terminal, a tablet, a medical device, exercise equipment, a personal digital assistant, and the like.

Referring to FIG. 5, the electronic device 500 may include one or more of the following components: a processing component 502, a memory 504, a power component 506, a multimedia component 508, an audio component 510, an input/output (I/O) interface 512, a sensor component 514, a communication component 516 and an image acquisition component 518.

The processing component 502 typically controls overall operations of the electronic device 500, such as the operations associated with display, telephone calls, data communications, camera operations, and recording operations. The processing component 502 may include one or more processors 520 to execute computer program. Moreover, the processing component 502 may include one or more modules which facilitate the interaction between the processing component 502 and other components. For instance, the processing component 502 may include a multimedia module to facilitate the interaction between the multimedia component 508 and the processing component 502.

The memory 504 is configured to store various types of data to support the operation of the electronic device 500. Examples of such data include computer programs for any applications or methods operated on the electronic device 500, contact data, phonebook data, messages, pictures, video, etc. The memory 504 may be implemented using any type of volatile or non-volatile memory devices, or a combination thereof, such as a static random access memory (SRAM), an electrically erasable programmable read-only memory (EEPROM), an erasable programmable read-only memory (EPROM), a programmable read-only memory (PROM), a read-only memory (ROM), a magnetic memory, a flash memory, a magnetic or optical disk.

The power component 506 provides power to various components of the electronic device 500. The power component 506 may include a power management system, one or more power sources, and any other components associated with the generation, management, and distribution of power in the electronic device 500.

The multimedia component 508 includes a screen providing an output interface between the electronic device 500 and the target object. In some embodiments, the screen may include a liquid crystal display (LCD), a touch panel (TP) or an Active Matrix Organic Light-Emitting Diode (AMO-LED). If the screen includes the touch panel, the screen may be implemented as a touch screen to receive input signals from the target object. The touch panel includes one or more touch sensors to sense touches, swipes, and gestures on the touch panel. The touch sensors may not only sense a boundary of a touch or swipe action, but also sense a period of time and a pressure associated with the touch or swipe action. The screen includes a display panel, that is, including the display driving module in the embodiments as shown in FIGS. 2 and 3.

The audio component 510 is configured to output and/or input audio signals. For example, the audio component 510 includes a microphone ("MIC") configured to receive an external audio signal when the electronic device 500 is in an operation mode, such as a call mode, a recording mode, and a voice recognition mode. The received audio signal may be further stored in the memory 504 or transmitted via the communication component 516. In some embodiments, the audio component 510 further includes a speaker to output audio signals.

The I/O interface 512 provides an interface between the processing component 502 and peripheral interface modules, such as a keyboard, a click wheel, buttons, and the like.

The sensor component 514 includes one or more sensors to provide status assessments of various aspects of the electronic device 500. For instance, the sensor component 514 may detect an open/closed status of the electronic device 500, relative positioning of components, e.g., the display and the keypad, of the electronic device 500, a change in position of the electronic device 500 or a component of the electronic device 500, a presence or absence of target object contact with the electronic device 500, an orientation or an acceleration/deceleration of the device 800, and a change in temperature of the electronic device 500.

The communication component 516 is configured to facilitate communication, wired or wirelessly, between the electronic device 500 and other devices. The electronic device 500 can access a wireless network based on a communication standard, such as Wi-Fi, 2G, 3G, 4G, 5G or a combination thereof. In one exemplary embodiment, the communication component 516 receives a broadcast signal or broadcast associated information from an external broadcast management system via a broadcast channel. In one exemplary embodiment, the communication component 516 further includes a near field communication (NFC) module to facilitate short-range communications. For example, the NFC module may be implemented based on a radio frequency identification (RFID) technology, an infrared data association (IrDA) technology, an ultra-wideband (UWB) technology, a Bluetooth (BT) technology, and other technologies.

In exemplary embodiments, the electronic device 500 may be implemented with one or more application specific integrated circuits (ASICs), digital signal processors (DSPs), digital signal processing devices (DSPDs), programmable logic devices (PLDs), field programmable gate arrays (FPGAs), controllers, micro-controllers, microprocessors, or other electronic components.

In exemplary embodiments, there is also provided a non-transitory computer-readable storage medium including executable computer programs, such as instructions included in the memory 504, executable by the processor. For example, the non-transitory computer-readable storage medium may be a ROM, a RAM, a CD-ROM, a magnetic tape, a floppy disc, an optical data storage device, and the like.

Various embodiments of the present disclosure can have one or more of the following advantages.

The display driving module can be formed by the first chip and the second chip that are vertically docked, where the first chip is docked with the second chip through docking of the first silicon wafer and the second silicon wafer; the first chip is configured to provide driving data, and the second chip is configured to process image data. In this way, by stacking the first chip and the second chip in this embodiment, the area of the display driving module can be reduced, and sufficient areas occupied by the circuits in the first chip and the second chip can be ensured, which facilitates improving the driving capability of the circuits in the first chip and the computing capability of the circuits in the second chip.

One of ordinary skill in the art will understand that the above described modules/units can each be implemented by hardware, or software, or a combination of hardware and software. One of ordinary skill in the art will also understand that multiple ones of the above described modules/units may be combined as one module/unit, and each of the above described modules/units may be further divided into a plurality of sub-modules/sub-units.

The various device components, modules, units, blocks, or portions may have modular configurations, or are composed of discrete components, but nonetheless can be referred to as "modules" in general. In other words, the "components," modules," "blocks," "portions," or "units" referred to herein may or may not be in modular forms, and these phrases may be interchangeably used.

In the present disclosure, the terms "installed," "connected," "coupled," "fixed" and the like shall be understood broadly, and can be either a fixed connection or a detachable connection, or integrated, unless otherwise explicitly defined. These terms can refer to mechanical or electrical connections, or both. Such connections can be direct connections or indirect connections through an intermediate medium. These terms can also refer to the internal connections or the interactions between elements. The specific meanings of the above terms in the present disclosure can be understood by those of ordinary skill in the art on a case-by-case basis.

In the description of the present disclosure, the terms "one embodiment," "some embodiments," "example," "specific example," or "some examples," and the like can indicate a specific feature described in connection with the embodiment or example, a structure, a material or feature included in at least one embodiment or example. In the present disclosure, the schematic representation of the above terms is not necessarily directed to the same embodiment or example.

Moreover, the particular features, structures, materials, or characteristics described can be combined in a suitable manner in any one or more embodiments or examples. In addition, various embodiments or examples described in the specification, as well as features of various embodiments or examples, can be combined and reorganized.

Implementations of the subject matter and the operations described in this disclosure can be implemented in digital electronic circuitry, or in computer software, firmware, or hardware, including the structures disclosed herein and their structural equivalents, or in combinations of one or more of them. Implementations of the subject matter described in this disclosure can be implemented as one or more computer programs, i.e., one or more portions of computer program instructions, encoded on one or more computer storage medium for execution by, or to control the operation of, data processing apparatus.

Alternatively, or in addition, the program instructions can be encoded on an artificially-generated propagated signal, e.g., a machine-generated electrical, optical, or electromagnetic signal, which is generated to encode information for transmission to suitable receiver apparatus for execution by a data processing apparatus. A computer storage medium can be, or be included in, a computer-readable storage device, a computer-readable storage substrate, a random or serial access memory array or device, or a combination of one or more of them.

Moreover, while a computer storage medium is not a propagated signal, a computer storage medium can be a source or destination of computer program instructions encoded in an artificially-generated propagated signal. The computer storage medium can also be, or be included in, one or more separate components or media (e.g., multiple CDs, disks, drives, or other storage devices). Accordingly, the computer storage medium can be tangible.

The operations described in this disclosure can be implemented as operations performed by a data processing apparatus on data stored on one or more computer-readable storage devices or received from other sources.

The devices in this disclosure can include special purpose logic circuitry, e.g., an FPGA (field-programmable gate array), or an ASIC (application-specific integrated circuit). The device can also include, in addition to hardware, code that creates an execution environment for the computer program in question, e.g., code that constitutes processor firmware, a protocol stack, a database management system, an operating system, a cross-platform runtime environment, a virtual machine, or a combination of one or more of them. The devices and execution environment can realize various different computing model infrastructures, such as web services, distributed computing, and grid computing infrastructures.

A computer program (also known as a program, software, software application, app, script, or code) can be written in any form of programming language, including compiled or interpreted languages, declarative or procedural languages, and it can be deployed in any form, including as a stand-alone program or as a portion, component, subroutine, object, or other portion suitable for use in a computing environment. A computer program can, but need not, correspond to a file in a file system. A program can be stored in a portion of a file that holds other programs or data (e.g., one or more scripts stored in a markup language document), in a single file dedicated to the program in question, or in multiple coordinated files (e.g., files that store one or more portions, sub-programs, or portions of code). A computer program can be deployed to be executed on one computer or on multiple computers that are located at one site or distributed across multiple sites and interconnected by a communication network.

The processes and logic flows described in this disclosure can be performed by one or more programmable processors executing one or more computer programs to perform actions by operating on input data and generating output. The processes and logic flows can also be performed by, and apparatus can also be implemented as, special purpose logic circuitry, e.g., an FPGA, or an ASIC.

Processors or processing circuits suitable for the execution of a computer program include, by way of example, both general and special purpose microprocessors, and any one or more processors of any kind of digital computer. Generally, a processor will receive instructions and data from a read-only memory, or a random-access memory, or both. Elements of a computer can include a processor configured to perform actions in accordance with instructions and one or more memory devices for storing instructions and data.

Generally, a computer will also include, or be operatively coupled to receive data from or transfer data to, or both, one or more mass storage devices for storing data, e.g., magnetic, magneto-optical disks, or optical disks. However, a computer need not have such devices. Moreover, a computer can be embedded in another device, e.g., a mobile telephone, a personal digital assistant (PDA), a mobile audio or video player, a game console, a Global Positioning System (GPS) receiver, or a portable storage device (e.g., a universal serial bus (USB) flash drive), to name just a few.

Devices suitable for storing computer program instructions and data include all forms of non-volatile memory, media and memory devices, including by way of example semiconductor memory devices, e.g., EPROM, EEPROM, and flash memory devices; magnetic disks, e.g., internal hard disks or removable disks; magneto-optical disks; and CD-ROM and DVD-ROM disks. The processor and the memory can be supplemented by, or incorporated in, special purpose logic circuitry.

To provide for interaction with a user, implementations of the subject matter described in this specification can be implemented with a computer and/or a display device, e.g., a VR/AR device, a head-mount display (HMD) device, a head-up display (HUD) device, smart eyewear (e.g., glasses), a CRT (cathode-ray tube), LCD (liquid-crystal display), OLED (organic light emitting diode), or any other monitor for displaying information to the user and a keyboard, a pointing device, e.g., a mouse, trackball, etc., or a touch screen, touch pad, etc., by which the user can provide input to the computer.

Implementations of the subject matter described in this specification can be implemented in a computing system that includes a back-end component, e.g., as a data server, or that includes a middleware component, e.g., an application server, or that includes a front-end component, e.g., a client computer having a graphical user interface or a Web browser through which a user can interact with an implementation of the subject matter described in this specification, or any combination of one or more such back-end, middleware, or front-end components.

The components of the system can be interconnected by any form or medium of digital data communication, e.g., a communication network. Examples of communication networks include a local area network ("LAN") and a wide area network ("WAN"), an inter-network (e.g., the Internet), and peer-to-peer networks (e.g., ad hoc peer-to-peer networks).

While this specification contains many specific implementation details, these should not be construed as limitations on the scope of any claims, but rather as descriptions of features specific to particular implementations. Certain features that are described in this specification in the context of separate implementations can also be implemented in combination in a single implementation. Conversely, various features that are described in the context of a single implementation can also be implemented in multiple implementations separately or in any suitable subcombination.

Moreover, although features can be described above as acting in certain combinations and even initially claimed as such, one or more features from a claimed combination can in some cases be excised from the combination, and the claimed combination can be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. In certain circumstances, multitasking and parallel processing can be advantageous. Moreover, the separation of various system components in the implementations described above should not be understood as requiring such separation in all implementations, and it should be understood that the described program components and systems can generally be integrated together in a single software product or packaged into multiple software products.

As such, particular implementations of the subject matter have been described. Other implementations are within the scope of the following claims. In some cases, the actions recited in the claims can be performed in a different order and still achieve desirable results. In addition, the processes depicted in the accompanying figures do not necessarily require the particular order shown, or sequential order, to achieve desirable results. In certain implementations, multitasking or parallel processing can be utilized.

It is intended that the specification and embodiments be considered as examples only. Other embodiments of the disclosure will be apparent to those skilled in the art in view of the specification and drawings of the present disclosure. That is, although specific embodiments have been described above in detail, the description is merely for purposes of illustration. It should be appreciated, therefore, that many aspects described above are not intended as required or essential elements unless explicitly stated otherwise.

Various modifications of, and equivalent acts corresponding to, the disclosed aspects of the example embodiments, in addition to those described above, can be made by a person of ordinary skill in the art, having the benefit of the present disclosure, without departing from the spirit and scope of the disclosure defined in the following claims, the scope of which is to be accorded the broadest interpretation so as to encompass such modifications and equivalent structures.

It should be understood that "a plurality" or "multiple" as referred to herein means two or more. "And/or," describing the association relationship of the associated objects, indicates that there may be three relationships, for example, A and/or B may indicate that there are three cases where A exists separately, A and B exist at the same time, and B exists separately. The character "/" generally indicates that the contextual objects are in an "or" relationship.

In the present disclosure, a first element being "on" a second element may indicate direct contact between the first and second elements, without contact, or indirect geometrical relationship through one or more intermediate media or layers, unless otherwise explicitly stated and defined. Similarly, a first element being "under," "underneath" or "beneath" a second element may indicate direct contact between the first and second elements, without contact, or indirect geometrical relationship through one or more intermediate media or layers, unless otherwise explicitly stated and defined.

Some other embodiments of the present disclosure can be available to those skilled in the art upon consideration of the specification and practice of the various embodiments disclosed herein. The present application is intended to cover any variations, uses, or adaptations of the present disclosure following general principles of the present disclosure and include the common general knowledge or conventional technical means in the art without departing from the present disclosure. The specification and examples can be shown as illustrative only, and the true scope and spirit of the disclosure are indicated by the following claims.

What is claimed is:

1. A display driving system comprising:
a first chip and a second chip that are vertically docked;
the first chip comprising:
a first substrate; and
a first metal connection point disposed at a side of the first chip distal from the first substrate;
the second chip comprising:
a second substrate; and
a second metal connection point disposed at a side of the second chip distal from the second substrate;
the first chip being docked with the second chip through docking of the first metal connection point and the second metal connection point;
wherein the first chip is configured to provide driving data, and the second chip is configured to process image data, and
wherein transistors in the first chip have a size larger than a size of transistors in the second chip.

2. The display driving system according to claim 1, wherein the first chip comprises a plurality of connection pins configured to connect to an external array substrate; the plurality of connection pins are provided on a side of the first substrate distal from the first metal connection point, and are connected to circuits in the first chip through vias on the first substrate.

3. The display driving system according to claim 1, wherein contact portions of the first metal connection point and the second metal connection point are planarized by a polishing process.

4. The display driving system according to claim 1, wherein the first chip comprises at least one of a source driving circuit, a gate driving circuit, a power supply control circuit including power devices, a digital-to-analog conversion circuit, and a Gamma circuit.

5. The display driving system according to claim 1, wherein the second chip comprises at least one of a grayscale mapping circuit, a T-CON circuit, a crystal oscillator circuit, an instruction control unit, a DSI physical layer, an image RAM module, a pixel enhancement module, a pixel color processing logic module, a sub-pixel rendering logic module, a pixel statistics and correction logic module, a shift register circuit, a latch circuit, and a De-mura cache.

6. The display driving system according to claim 1, wherein an area of the first chip is larger than an area of the second chip.

7. The display driving system according to claim 1, wherein an area of the first chip is equal to an area of the second chip; the second chip comprises a first area and a second area, a circuit for processing image data is provided in the first area, and an amplified logic circuit is provided in the second area.

8. A display panel comprising an array substrate, and a display drive system, the display drive system comprising:
 a first chip and a second chip that are vertically docked;
 the first chip comprising:
 a first substrate; and
 a first metal connection point disposed at a side of the first chip distal from the first substrate;
 the second chip comprising:
 a second substrate; and
 a second metal connection point disposed at a side of the second chip distal from the second substrate;
 the first chip being docked with the second chip through docking of the first metal connection point and the second metal connection point;
 wherein the first chip is configured to provide driving data, and the second chip is configured to process image data;
 wherein a plurality of connection pins of the first chip in the display drive system are coupled to connection terminals on the array substrate, and are configured to provide driving data and processed image data to the array substrate; and
 wherein transistors in the first chip have a size larger than a size of transistors in the second chip.

9. The display panel according to claim 8, wherein the plurality of connection pins are provided on a side of the first substrate distal from the first metal connection point, and are coupled to circuits in the first chip through vias on the first substrate.

10. The display panel according to claim 8, wherein contact portions of the first metal connection point and the second metal connection point are planarized by a polishing process.

11. The display panel according to claim 8, wherein the first chip comprises at least one of a source driving circuit, a gate driving circuit, a power supply control circuit including power devices, a digital-to-analog conversion circuit and a Gamma circuit.

12. The display panel according to claim 8, wherein the second chip comprises at least one of a gray-scale mapping circuit, a T-CON circuit, a crystal oscillator circuit, an instruction control unit, a DSI physical layer, an image RAM module, a pixel enhancement module, a pixel color processing logic module, a sub-pixel rendering logic module, a pixel statistics and correction logic module, a shift register circuit, a latch circuit and a De-mura cache.

13. The display panel according to claim 8, wherein an area of the first chip is larger than an area of the second chip.

14. The display panel according to claim 8, wherein an area of the first chip is equal to an area of the second chip; the second chip comprises a first area and a second area, a circuit for processing image data is provided in the first area, and an amplified logic circuit is provided in the second area.

15. An electronic device comprising the display panel according to claim 8, further comprising:
 a processor; and
 memory for storing a computer program executable by the processor,
 wherein the processor is configured to execute the computer program in the memory to provide display on the display panel.

16. An apparatus comprising the display driving system according to claim 1, further comprising an Active Matrix Organic Light-Emitting Diode (AMOLED) display screen.

17. The apparatus according to claim 16, wherein by stacking the first chip and the second chip, an area of the display driving system is reduced to ensure sufficient areas occupied by circuits in the first chip and the second chip, thereby improving driving capability of the circuits in the first chip and computing capability of the circuits in the second chip.

18. The apparatus according to claim 17, wherein transistors in the circuits of the first chip are manufactured in a first process to thereby have a first average size, and transistors in the circuits of the second chip are manufactured in a second process to thereby have a second average size, and wherein the first average size is larger than the second average size.

* * * * *